(12) United States Patent
Wada et al.

(10) Patent No.: US 7,320,914 B1
(45) Date of Patent: Jan. 22, 2008

(54) SYSTEM AND METHOD FOR GATE FORMATION IN A SEMICONDUCTOR DEVICE

(75) Inventors: Hajime Wada, Sunnyvale, CA (US); Jaeyong Park, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 348 days.

(21) Appl. No.: 11/062,629

(22) Filed: Feb. 23, 2005

(51) Int. Cl.
*H01L 21/336* (2006.01)

(52) U.S. Cl. ............ 438/260; 438/596; 438/655; 257/E21.622

(58) Field of Classification Search ........... 438/260, 438/596; 257/E21.622, E21.626
See application file for complete search history.

(56) References Cited

U.S. PATENT DOCUMENTS

| | | | | |
|---|---|---|---|---|
| 5,686,331 A | * | 11/1997 | Song | 438/303 |
| 5,981,365 A | * | 11/1999 | Cheek et al. | 438/592 |
| 2004/0014290 A1 | * | 1/2004 | Yang et al. | 438/288 |

\* cited by examiner

*Primary Examiner*—Chandra Chaudhari
(74) *Attorney, Agent, or Firm*—Harrity Snyder, LLP

(57) ABSTRACT

A method for forming a memory device is provided. A first layer is formed over a substrate. A second layer is formed over the first layer. A mask is formed over the second layer. Spacers are formed adjacent opposite sides of the mask. The second layer is etched to form at least one memory cell stack. The memory device is cleaned to remove the mask. A silicide region is formed within the second layer in the at least one memory cell stack, where the silicide region in each memory cell stack is bounded by the spacers.

18 Claims, 7 Drawing Sheets

US 7,320,914 B1

SYSTEM AND METHOD FOR GATE FORMATION IN A SEMICONDUCTOR DEVICE

TECHNICAL FIELD

The present invention relates generally to semiconductor devices and, more particularly, to fabrication of semiconductor devices.

BACKGROUND ART

Conventional semiconductor flash or block erase Electrically Erasable Programmable Read-Only Memory (Flash EEPROM) devices include arrays of cells that can be independently programmed and read. The size of each cell and thereby the memory device are made small by omitting transistors known as select transistors that enable the cells to be erased independently. As a result, a group of the cells must be erased together as a block.

Flash memory devices of this type may include individual memory cells characterized by a vertical stack of a tunnel oxide (e.g., $SiO_2$), a polysilicon floating gate over the tunnel oxide, an interlayer dielectric over the floating gate, and a control gate over the interlayer dielectric. The vertical stack may be formed on a crystalline silicon substrate. The substrate may include a channel region positioned below the vertical stack and source and drain on opposing sides of the channel region. Various voltages may be applied to the cell elements to program the cell with a binary 1 or 0, to erase all or some of the cells as a block, to read the cell, to verify that the cell is erased, or to verify that the cell is not over-erased.

Another type of memory cell structure is characterized by a vertical stack that includes an insulating tunnel oxide layer, a charge trapping nitride layer, an insulating top oxide layer, and a polysilicon control gate, all positioned on top of a crystalline silicon substrate. This particular structure of a silicon channel region, tunnel oxide, nitride, top oxide, and polysilicon control gate is often referred to as a SONOS (silicon-oxide-nitride-oxide-silicon) device.

Another type of memory cell structure incorporates a metal-based silicide, such as titanium silicide in the control gates of the memory cells. In this type of memory cell, a layer of metal is formed over the control gate and then annealed. The resulting structure includes a control gate formed of a composite metal-silicide material sharing desirable properties of both nonmetallic (e.g., polysilicon) and metallic gate structures, such as low resistivity and resistance to electromigration.

Memory cells in a flash memory device are typically connected in an array of rows and columns, with the control gates of the cells in a row being connected to a respective word line and the drains of the cells in a column being connected to a respective bit line. To operate efficiently and reliably, each cell must be effectively isolated from neighboring cells. Unfortunately, as the dimensions of memory devices have gotten smaller, control gates of neighboring cells may become shorted during silicide formation.

DISCLOSURE OF THE INVENTION

In an implementation consistent with the principles of the invention, a method is provided for forming a memory device. A first layer is formed over a substrate. A second layer is formed over the first layer. A mask is formed over the second layer. Spacers are formed adjacent opposite side surfaces of the mask. The second layer is etched to form at least one memory cell stack. The mask is removed. A silicide region is formed on the second layer in the at least one memory cell stack, where the silicide region in each memory cell stack is bounded by the spacers.

In another implementation consistent with the principles of the invention, a method for fabricating a semiconductor device is provided. The method includes forming a gate layer over a substrate; forming at least one mask over the gate layer; forming structures on opposite sides of the at least one mask; removing the at least one mask; and forming a silicide region within the gate layer, where the silicide region is bounded by the spacers.

In yet another implementation consistent with the principles of the invention, a method is provided for making a semiconductor memory device. The method includes forming at least one memory cell stack over a substrate. The at least one memory cell stack includes: a first dielectric layer formed on the substrate, a charge storage element formed on the first dielectric, an intergate dielectric formed on the charge storage element, and a gate layer formed over the substrate. A mask layer is formed over the gate layer. Spacers are formed over the gate layer on opposite sides of the mask. A dielectric layer is formed over the semiconductor memory device. The dielectric layer is etched to expose at least an upper surface of the mask. The mask layer is removed and a silicide region is formed in the gate layer, where the silicide region is prevented from extending into the dielectric layer by the spacers.

BRIEF DESCRIPTION OF THE DRAWINGS

The accompanying drawings, which are incorporated in and constitute a part of this specification, illustrate an embodiment of the invention and, together with the description, explain the invention. In the drawings.

BEST MODE FOR CARRYING OUT THE INVENTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
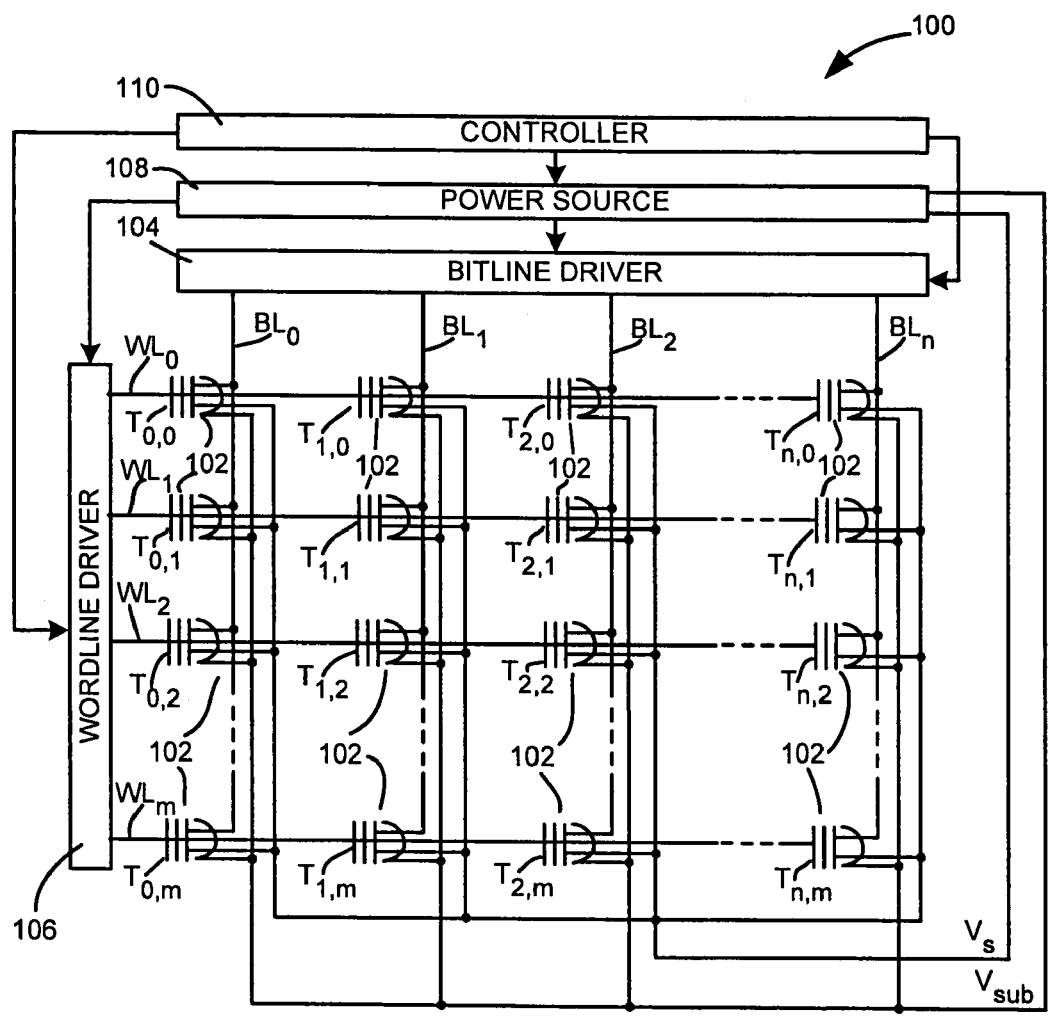
FIG. 1 illustrates an exemplary configuration of a flash EEPROM formed in accordance with an embodiment of the present invention.

Implementations consistent with the present invention provide non-volatile memory devices, such as flash electrically erasable programmable read only memory (EEPROM) devices. FIG. 1 illustrates an exemplary configuration of a flash EEPROM 100 formed in accordance with an embodiment of the present invention. Flash memory 100 may include a plurality of memory cells 102, arranged in a rectangular matrix or array of rows and columns, a plurality of bit lines (BL) associated with each column, a plurality of word lines (WL) associated with each row, a bit line driver 104, a word line driver 106, a power source 108 and a controller 110.

Assuming that there are n columns and m rows in EEPROM 100, the bit lines may be designated as $BL_0$ to $BL_n$ and the word lines may be designated as $WL_0$ to $WL_m$. Accordingly, there may be n+1 bit lines and m+1 word lines. Bit line driver 104 applies appropriate voltages to the bit lines. Similarly, appropriate voltages are applied to the word lines by word line driver 106. The voltages applied to drivers 104 and 106 may be generated by a power source 108 under the control of a controller 110, which may include on-chip logic circuitry. The controller 110 may also control the drivers 104 and 106 to address the memory cells individually or collectively.

A memory cell 102 is located at each junction of a word line and a bit line. Each cell 102 includes a Metal-Oxide-Semiconductor (MOS) Field Effect Transistor (FET) having a source and drain formed in a semiconductor substrate, a charge storage element, and a control gate separated from the charge storage element by an intergate dielectric. Additional details regarding the formation of cell 102 will be described below in relation to FIGS. 2-12. As should be appreciated, the cells of a flash EEPROM differ from conventional FETs in that they include the charge storage element and tunnel oxide layer disposed between the control gate and the semiconductor substrate in which the source and drain are formed.

Cells 102 illustrated in FIG. 1 may be designated using the notation $T_{i,j}$, where j is the row (word line) number and i is the column (bit line) number. The control gates of cells 102 are connected to respective word lines, and the drains of cells 102 are connected to respective bit lines as illustrated. The sources of all of the cells are connected to the power source 108.

In addition to a core memory array, as describe above, a flash memory device may also include a peripheral microcontroller circuit formed on a portion of the flash memory device adjacent to the core memory array. Many high voltage transistors are used in the peripheral circuit to provide the appropriate voltage required to program/erase the core memory cells.

Exemplary Processing

Figure 2:
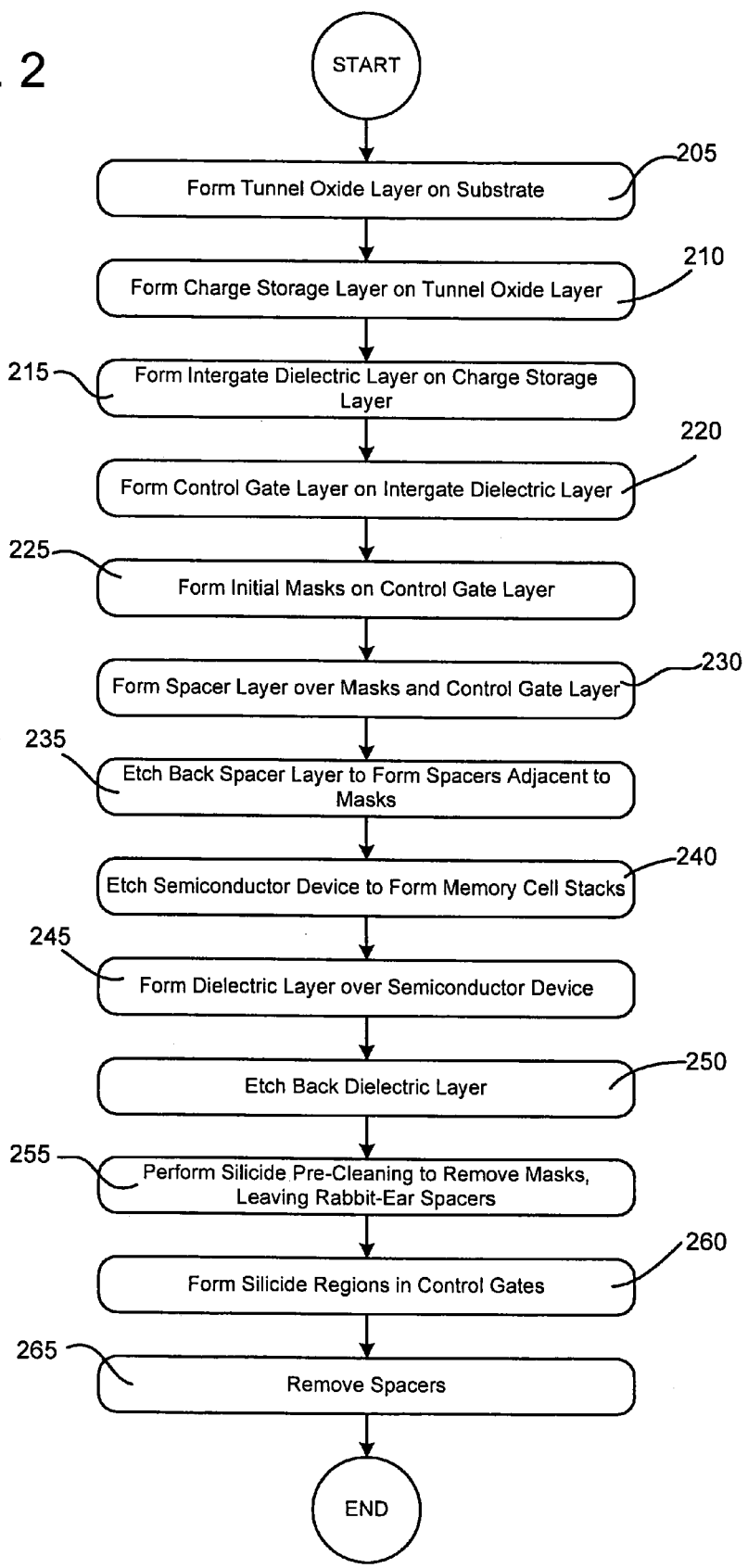
FIG. 2 is a flow diagram illustrating an exemplary process for forming a semiconductor memory device in an implementation consistent with the principles of the invention.

FIG. 2 illustrates an exemplary process for forming a semiconductor memory device in an implementation consistent with the principles of the invention. In one implementation, the semiconductor memory device includes an array of memory cells of a flash memory device, such as that illustrated in FIG. 1. FIGS. 3-12 illustrate exemplary views of a semiconductor memory device fabricated according to the processing described in FIG. 2.

Figure 3:
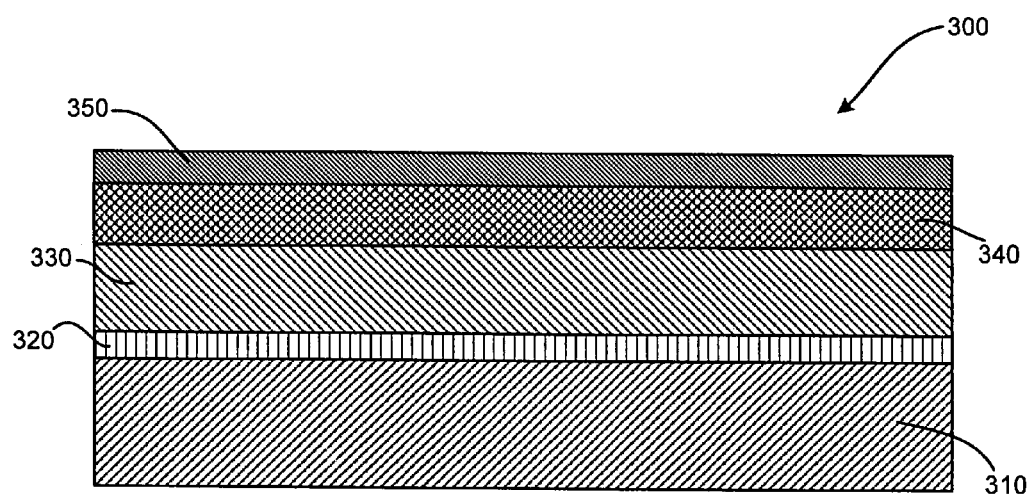
FIGS. 3-12 illustrate exemplary views of a semiconductor memory device fabricated according to the processing described in FIG. 2.

With reference to FIGS. 2 and 3, processing may begin with a semiconductor device 300 that includes layers 310, 320, 330, 340, and 350. In an exemplary embodiment, layer 310 may include a substrate of semiconductor device 300 and may include silicon, germanium, silicon-germanium or other semiconducting materials. In alternative implementations, layer 310 may be a conductive layer or a dielectric layer formed a number of layers above the surface of a substrate in semiconductor device 300.

Layer 320 may be a dielectric layer formed on layer 310 in a conventional manner (act 205). In an exemplary implementation, dielectric layer 320 may include an oxide, such as a silicon oxide (e.g., $SiO_2$), and may have a thickness ranging from about 50 Å to about 200 Å. Dielectric layer 320 may function as a tunnel oxide layer for a subsequently formed memory cell of semiconductor device 300. In one implementation consistent with principles of the invention, a suitable method for forming layer 320 may be a thermal oxidation process of layer 310 at a temperature of about 950° C. to 1100° C. Alternatively, layer 320 may be deposited using a low pressure chemical vapor deposition (LPCVD) process performed at a temperature of about 400° C. to 800° C.

Layer 330 may be formed on layer 320 in a conventional manner and may act as a charge storage or floating gate layer for semiconductor device 300 (act 210). In an exemplary implementation, layer 330 may include a silicon, such as polycrystalline silicon ("polysilicon"), or a nitride, such as silicon nitride (e.g., $Si_3N_4$), and may have a thickness ranging from about 400 Å to about 900 Å. In one implementation consistent with principles of the invention, a suitable method for forming layer 330 may be chemical vapor deposition (CVD), although suitable alternative deposition techniques may also be employed.

Layer 340 may be a dielectric layer formed on layer 330 in a conventional manner (act 215). In an exemplary implementation, dielectric layer 340 may include an oxide, such as a silicon oxide (e.g., $SiO_2$), and may have a thickness ranging from about 50 Å to about 500 Å. Layer 340 may function as an intergate dielectric layer for a subsequently formed memory cell of semiconductor device 300.

Layer 350 may be formed on layer 340 in a conventional manner and may include a silicon, such as polysilicon, or amorphous silicon (act 220). Layer 350, consistent with principles of the invention, may ultimately act as a control gate for semiconductor device 300 and may have a thickness ranging from about 500 Å to about 2500 Å.

Figure 4:
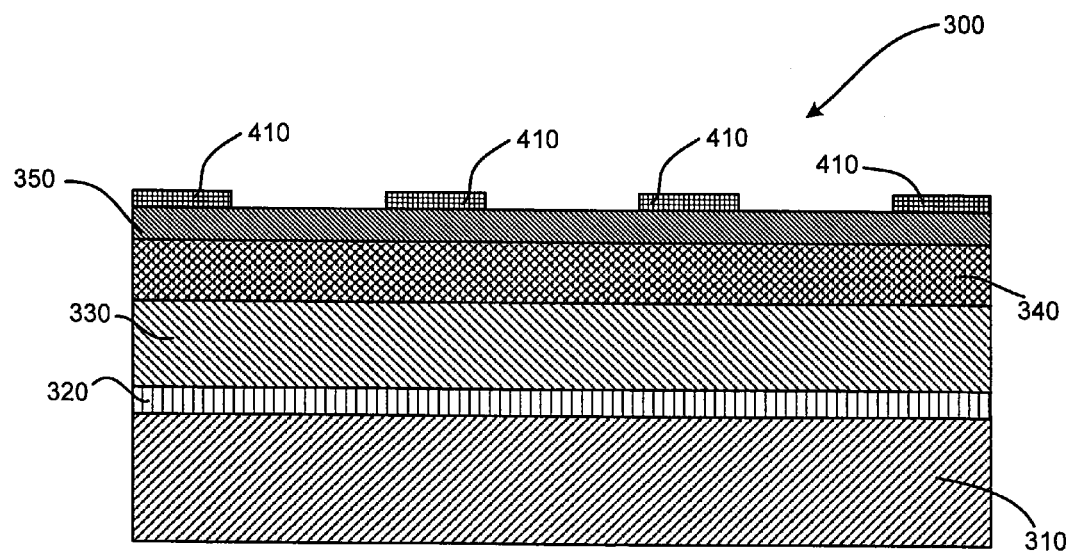

A hard mask layer may be patterned and etched in a conventional manner to form hard masks 410 on a top surface of layer 350, as illustrated in FIG. 4 (act 225). Hard masks 410 may be formed of an oxide or nitride material (or a combination of oxide and nitride layers) and may be used to define active regions in the subsequently formed memory device and indicate areas that will not be etched during formation of the memory cells in semiconductor device 300. Hard masks 410 may have a thickness ranging from about 500 Å to about 1500 Å and a width ranging from about 500 Å to about 2000 Å.

Figure 5:
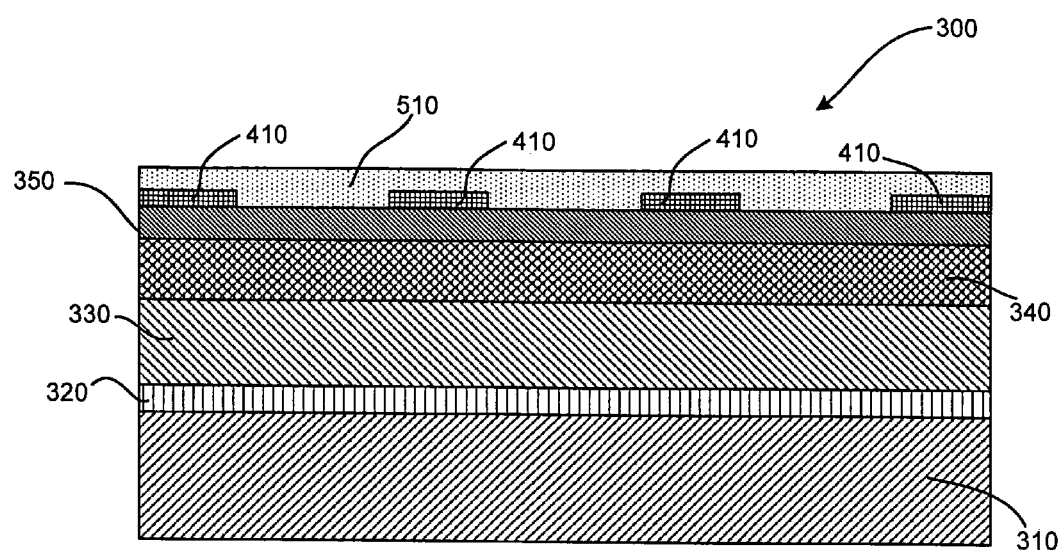
Figure 6:
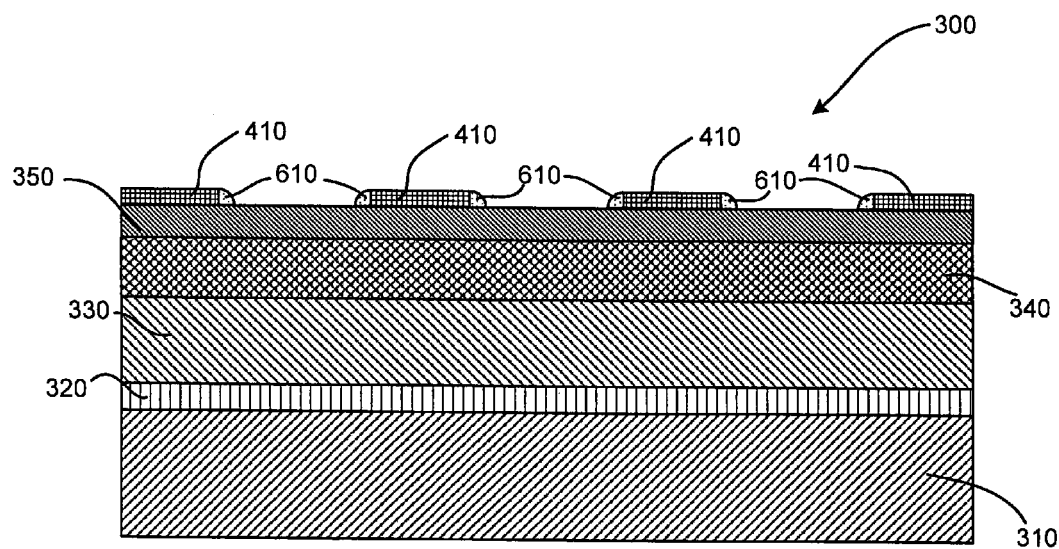

A spacer layer 510 may then be formed over semiconductor device 300, as illustrated in FIG. 5 (act 230). In one implementation, spacer layer 510 may be formed by depositing a layer of silicon oxide ($SiO_2$), tetraethylorthosilicate (TEOS) or nitride (e.g., $Si_3N_4$) via CVD. Following deposition, spacer layer 510 may be anisotropically etched in a well known manner to form spacers 610 adjacent side surfaces of hard masks 410, as illustrated in FIG. 6 (act 235). In an exemplary implementation, the width of spacers 610 may range from about 100 Å to about 1000 Å.

Figure 7:
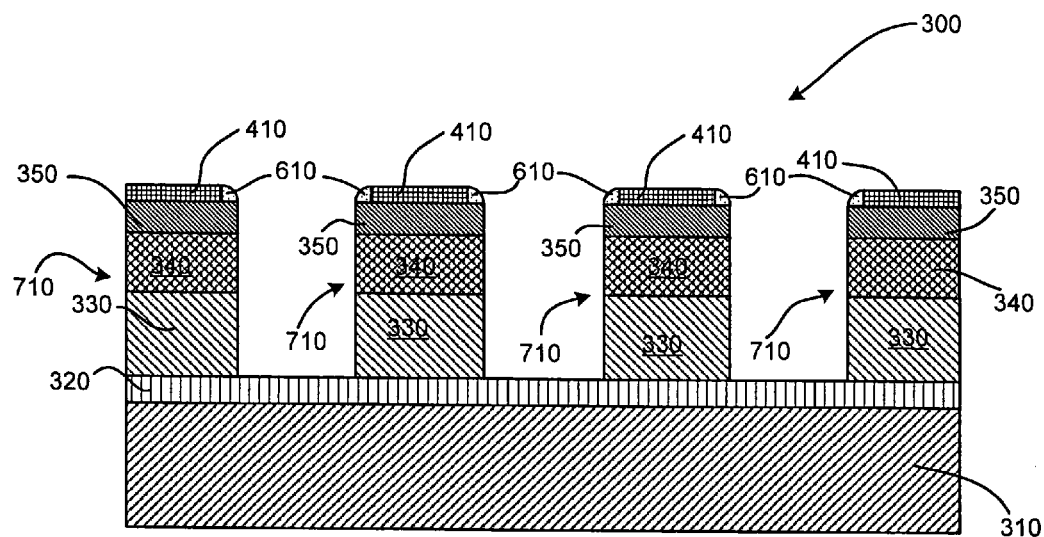
Figure 8:
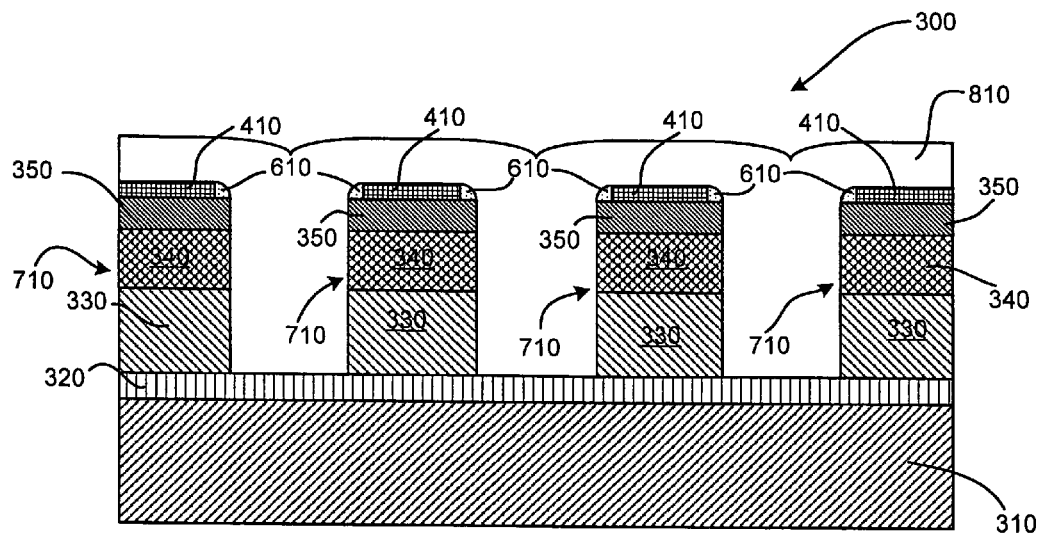

Semiconductor device 300 may then be etched in a conventional manner, with the etching terminating on tunnel oxide layer 320 (act 240). As illustrated in FIG. 7, portions of layers 330, 340, and 350 are thereby removed to form a number of individual memory cell stacks 710. Following etching, a dielectric layer 810 may be formed or grown over semiconductor device 300, as illustrated in FIG. 8, to provide isolation between memory cell stacks 710 (act 245). As shown in FIG. 8, dielectric layer 810 may be formed on the exposed surfaces of memory cell stacks 710 and tunnel oxide layer 320. In one exemplary implementation, dielectric layer 810 may be formed of silicon nitride (e.g., $Si_3N_4$), although suitable alternate materials (e.g., TEOS, SiO$_2$, etc.) may be used and may have a thickness ranging from about 300 Å to about 1000 Å.

Figure 9:
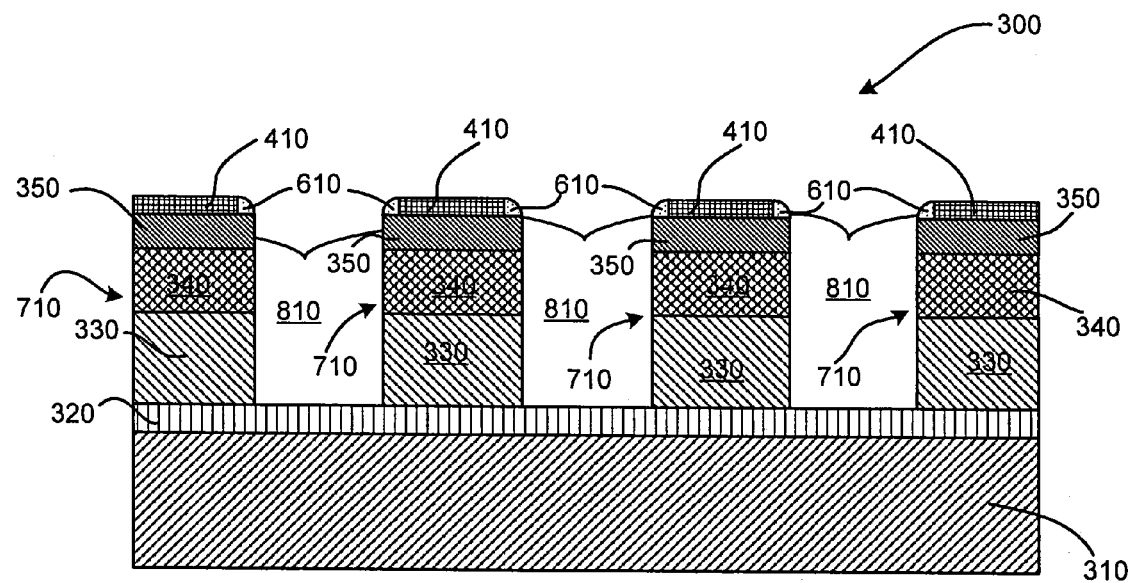

Dielectric layer 810 may then be etched back in a conventional manner (e.g., using a dry etch, such as plasma etching, or using a chemical wet etch process), as illustrated in FIG. 9 to expose at least upper surfaces of memory cell stacks 710 (act 250). In one implementation consistent with principles of the invention, dielectric layer 810 may be etched back so that it remains present only between (and not over) memory cell stacks 710.

Figure 10:
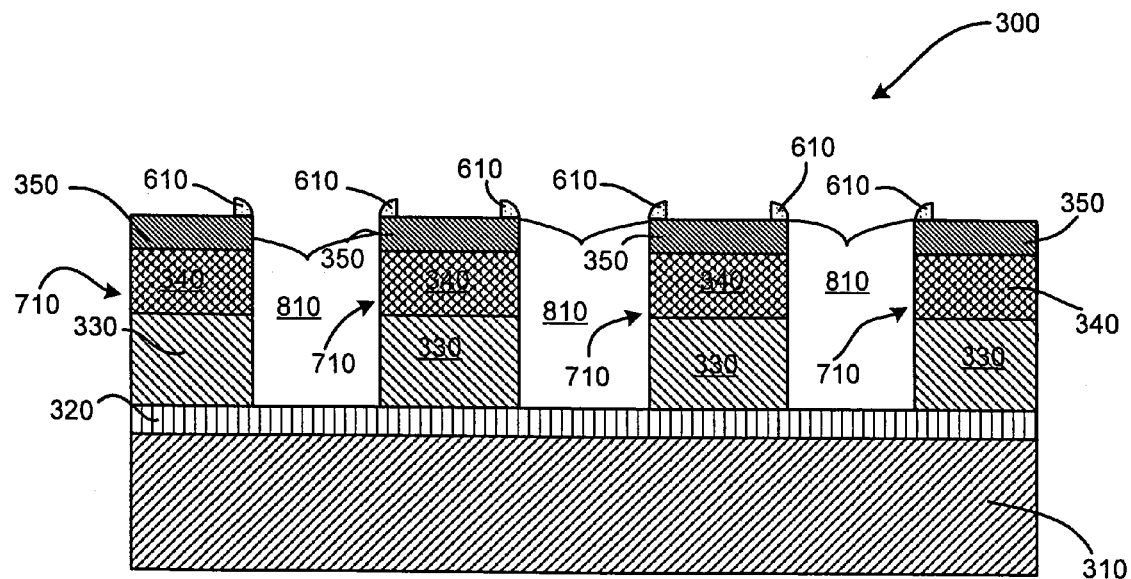

Following etch back of dielectric layer 810, a silicide pre-cleaning process may be performed (act 255). As illustrated in FIG. 10, in one implementation consistent with principles of the invention, silicide pre-cleaning effectively removes hard masks 410 from semiconductor device 300 and leaves only spacers 610 on layer 350. That is, the pre-cleaning process may be selective to remove hard masks 410 without removing spacers 610. In an exemplary implementation, the pre-cleaning may be a chemical wet or dry etching, or a combination of wet and dry etching processes. In an exemplary implementation, the remaining spacers 610 may have a substantially "rabbit-ear" like cross-section designed to prevent subsequent silicide formation from effecting dielectric layer 810 and potentially shorting two or more memory cell stacks 710.

Figure 11:
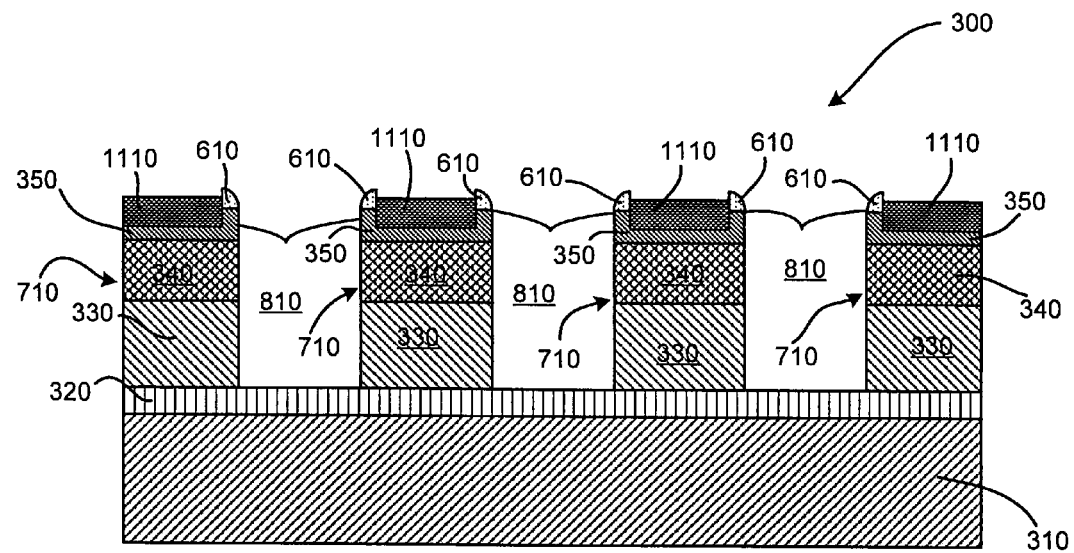
Figure 12:
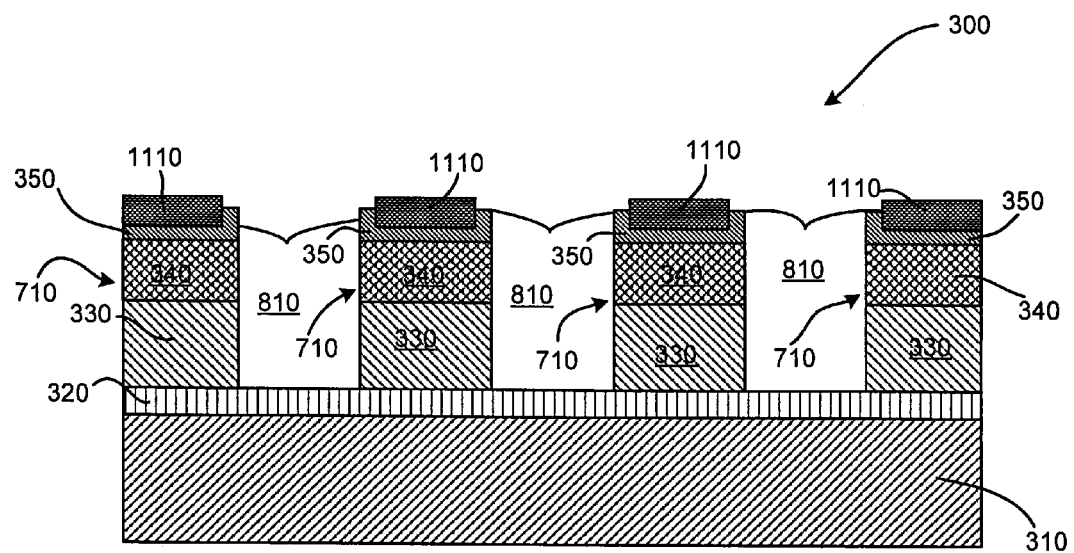

Silicide regions 1110 may then be formed on layer 350 of memory cell stacks 710 in a conventional manner (act 260), as illustrated in FIG. 11. As is known in the art, silicides, such as titanium silicide, cobalt silicide, molebdynum silicide, etc. may be formed on polysilicon control gates of semiconductor devices by depositing or sputtering a layer of metal (e.g., titanium, molebdynum, cobalt, etc.) on the polysilicon gate layer 350. The device may then be annealed using, for example, a low temperature Rapid Thermal Anneal (RTA) process at a temperature ranging from approximately 400° C. to 600° C. to form a metal-silicon compound. Unreacted metal is then removed, and a high temperature RTA process is performed at a temperature ranging from approximately 700° C. to 900° C. to change the metal-silicon compound to metal silicide. Since, the spacers 610 are made of a dielectric, such as TEOS or nitride, the metal does not react with the material of spacers 610 and silicide does not form on the spacers 610 during silicide formation. Therefore, the methodology of the invention prevents silicide formation on the outermost portions of control gate 350, as illustrated in FIG. 11. In addition, the metal does not react with dielectric layer 810 and no silicide is formed over dielectric layer 810. This prevents silicide shorting between adjacent memory cell stacks 710. Following silicide formation, spacers 610 may be removed e.g., by an etching or planarization process (act 265). A resulting semiconductor device is illustrated in FIG. 12.

As described above, a semiconductor fabrication methodology is provided. By using spacers formed on control gate layer 350, silicide shorting during silicide formation on control gates 350 may be minimized or eliminated, thereby advantageously enhancing the performance of the semiconductor device.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, the methodology has been discussed above with respect to preventing silicide shorting between control gates in memory devices. In alternative embodiments, the control gates may be control gates for conventional MOSFET transistors and the methodology may be used to prevent silicide shorting between gates on the transistor devices. In addition, in the above descriptions, numerous specific details are set forth, such as specific materials, structures, chemicals, processes, etc., in order to provide a thorough understanding of the present invention. However, implementations consistent with the invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 2, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method for forming a memory device, comprising:
   forming a first layer over a substrate;
   forming a second layer over the first layer;
   forming a mask over the second layer;
   forming spacers adjacent opposite side surfaces of the mask;
   etching the second layer to form at least one memory cell stack;
   forming a dielectric layer over the memory device;
   etching the dielectric layer to expose at least an upper surface of the at least one memory cell stack;
   removing the mask; and
   forming a silicide region on the second layer in the at least one memory cell stack,
   wherein the silicide region in each memory cell stack is bounded by the spacers.

2. The method of claim 1, further comprising:
   forming a second dielectric layer on the substrate; and
   forming a charge storage element on the second dielectric layer, where the first layer comprises an oxide layer formed on the charge storage element.

3. The method of claim 1, wherein the second layer comprises a polysilicon layer.

4. The method of claim 3, wherein the polysilicon layer has a thickness ranging from about 500 Å to about 2500 Å.

5. The method of claim 1, wherein the mask is formed of silicon oxide.

6. The method of claim 1, wherein the mask has a thickness ranging from about 500 Å to about 1500 Å and a width ranging from about 500 Å to about 2000 Å.

7. The method of claim 1, wherein forming spacers comprises:
   depositing a spacer layer over the memory device; and
   etching the spacer layer to form the spacers adjacent opposite side surfaces of the mask.

8. The method of claim 1, wherein the spacers have a substantially rabbit-ear-shaped cross-section on opposite sides of the mask.

9. The method of claim 1, wherein the spacers are formed of silicon oxide.

10. The method of claim 1, wherein the spacers have a width ranging from about 100 Å to about 1000 Å.

11. The method of claim 1, wherein forming the spacers comprises:
depositing a spacer layer by chemical vapor deposition.

12. The method of claim 1, wherein the dielectric layer comprises a silicon nitride.

13. The method of claim 1, wherein the forming a silicide region comprises:
depositing a metal on the second layer of the at least one memory cell stack; and
thermally annealing the memory device to create the silicide region on the second layer of the at least one memory cell stack.

14. The method of claim 12, wherein thermally annealing comprises:
annealing the memory device at a temperature ranging from about 400° C. to about 600° C. to form a metal-silicon compound;
removing unreacted metal from the memory device; and
thermally annealing the memory device at a temperature ranging from about 700° C. to about 900° C. to change the metal-silicon compound to a metal silicide to create the silicide region on the second layer of the at least one memory cell stack.

15. The method of claim 1, comprising:
removing the spacers.

16. The method of claim 15, wherein removing the spacers comprises etching the memory device to remove the spacers.

17. The method of claim 1, comprising:
forming a charge storage layer above the first layer, wherein the first layer is a tunnel oxide layer; and
forming a intergate dielectric layer above the charge storage layer,
wherein the second layer is a control gate layer formed over the intergate dielectric layer.

18. A method for making a semiconductor memory device, comprising:
forming at least one memory cell stack over a substrate, wherein the at least one memory cell stack comprises:
a first dielectric layer formed on the substrate;
a charge storage element formed on the first dielectric layer;
an intergate dielectric formed on the charge storage element; and
a gate layer formed over the intergate dielectric;
forming a mask over the gate layer;
forming spacers over the gate layer on opposite sides of the mask;
forming a dielectric layer over the semiconductor memory device;
etching the dielectric layer to expose at least an upper surface of the mask;
removing the mask; and
forming a silicide region in the gate layer, wherein the silicide region is prevented from extending into the dielectric layer by the spacers.

* * * * *